United States Patent
Suzuki (10) Patent No.: US 10,325,858 B2
(45) Date of Patent: Jun. 18, 2019

(54) SEMICONDUCTOR DEVICE CHIP AND METHOD OF MANUFACTURING SEMICONDUCTOR DEVICE CHIP

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 4 days.

(21) Appl. No.: 15/865,896

(22) Filed: Jan. 9, 2018

(65) Prior Publication Data
US 2018/0197823 A1 Jul. 12, 2018

(30) Foreign Application Priority Data
Jan. 10, 2017 (JP) ................. 2017-001724

(51) Int. Cl.
| | | |
|---|---|---|
| *H01L 23/66* | (2006.01) | |
| *H01L 25/00* | (2006.01) | |
| *H01L 21/683* | (2006.01) | |
| *H01L 23/552* | (2006.01) | |
| *H01L 23/538* | (2006.01) | |
| *H01L 21/78* | (2006.01) | |
| *H01L 21/67* | (2006.01) | |
| *H01L 21/304* | (2006.01) | |

(52) U.S. Cl.
CPC ........ *H01L 23/552* (2013.01); *H01L 21/6836* (2013.01); *H01L 23/5386* (2013.01); *H01L 23/66* (2013.01); *H01L 25/50* (2013.01); *H01L 21/304* (2013.01); *H01L 21/67092* (2013.01); *H01L 21/78* (2013.01)

(58) Field of Classification Search
CPC ... H01L 23/552; H01L 23/5386; H01L 23/66; H01L 25/50; H01L 21/78; H01L 21/67092; H01L 21/304

USPC .......................................................... 257/659
See application file for complete search history.

(56) References Cited

U.S. PATENT DOCUMENTS

2006/0046349 A1* 3/2006 Takeuchi ............ G03F 7/70983
438/106
2014/0179083 A1* 6/2014 Buenning ............... H01L 21/78
438/463

(Continued)

FOREIGN PATENT DOCUMENTS

JP 2001-044680 A 2/2001
JP 2004-072051 A 3/2004

*Primary Examiner* — Mohsen Ahmadi
*Assistant Examiner* — Patricia D Reddington
(74) *Attorney, Agent, or Firm* — Greer Burns & Crain, Ltd.

(57) ABSTRACT

A semiconductor device chip includes a semiconductor substrate having a first surface and a second surface opposite to the first surface, a semiconductor device disposed on the first surface of the semiconductor substrate, an interconnect pattern having an end connected to the semiconductor device and another end exposed on a surface of a function layer disposed on the first surface of the semiconductor substrate, plurality of external connection electrodes mounted on the surface of the function layer and electrically connected to the other end of the interconnect pattern, an electromagnetic wave shield film for shielding electromagnetic waves, which is disposed on the second surface of the semiconductor substrate and side surfaces of the function layer, and a ground interconnect electrically connected to the electromagnetic shield film and disposed on the function layer.

8 Claims, 7 Drawing Sheets

(56) References Cited

U.S. PATENT DOCUMENTS

| | | | |
|---|---|---|---|
| 2014/0213041 A1* | 7/2014 | Lei | H01L 21/78 |
| | | | 438/462 |
| 2016/0035680 A1* | 2/2016 | Wu | H01L 23/552 |
| | | | 257/659 |
| 2016/0233111 A1* | 8/2016 | Shiota | H01L 21/304 |
| 2017/0005042 A1* | 1/2017 | Chen | H01L 23/552 |

* cited by examiner

SEMICONDUCTOR DEVICE CHIP AND METHOD OF MANUFACTURING SEMICONDUCTOR DEVICE CHIP

BACKGROUND OF THE INVENTION

Field of the Invention

The present invention relates to a semiconductor device chip and a method of manufacturing a semiconductor device chip.

Description of the Related Art

In recent years, mobile wireless communication apparatus such as mobile phones, smartphones, etc. have been seeing an increase in the number of electronic components such as surface acoustic wave (SAW) devices, antenna elements, etc. that make up a wireless system in the apparatus. One problem is that the data transfer rates of various semiconductor packages such as dynamic random access memories (DRAMs), flash memories, etc. in the apparatus have so risen that electromagnetic waves generated by the various semiconductor packages tend to act as noise which adversely affects the wireless system.

At present, a solution to the problem is to use sheet metal shields that surround circuits including such semiconductor packages inducing electromagnetic wave noise, with metal sheets (see, for example, Japanese Patent Laid-Open No. 2001-44680 and Japanese Patent Laid-Open No. 2004-72051)

SUMMARY OF THE INVENTION

However, the sheet metal shields as disclosed in Japanese Patent Laid-Open No. 2001-44680 and Japanese Patent Laid-Open No. 2004-72051 have presented an obstacle to efforts to reduce the size and thickness of mobile wireless communication apparatus such as mobile phones, smartphones, etc. as they make the component installation area in the apparatus large.

It is an object of the present invention to provide a semiconductor device chip and a method of manufacturing a semiconductor device chip which are capable of shielding electromagnetic wave noise which would otherwise adversely affect a wireless system, without using sheet metal shields.

In accordance with an aspect of the present invention, there is provided a semiconductor device chip including a semiconductor substrate having a first surface and a second surface opposite to the first surface, a semiconductor device disposed on the first surface of the semiconductor substrate, an interconnect pattern having an end connected to the semiconductor device and other end exposed on a surface of a function layer disposed on the first surface of the semiconductor substrate, a plurality of external connection electrodes mounted on the surface of the function layer and electrically connected to the other end of the interconnect pattern, an electromagnetic wave shield film for shielding electromagnetic waves, the electromagnetic wave shield film being disposed on the second surface of the semiconductor substrate and side surfaces of the function layer, and a ground interconnect electrically connected to the electromagnetic wave shield film and disposed on the function layer.

In accordance with another aspect of the present invention, there is provided a method of manufacturing a semiconductor device chip, including a preparing step of preparing a semiconductor wafer including a semiconductor substrate having a first surface, a function layer disposed on the first surface of the semiconductor substrate, a plurality of semiconductor devices each formed in respective areas demarcated on the function layer by a plurality of projected dicing lines thereon, a plurality of external connection electrodes disposed on a surface of the function layer, and an interconnect pattern disposed on the function layer and electrically connecting the semiconductor devices and the external connection electrodes to each other, a protective film applying step of applying a liquid resin on an entire surface of the function layer on which the external connection electrodes are disposed, thereby forming a protective film, a dividing step of dividing the semiconductor wafer into a plurality of individual semiconductor device chips along the projected dicing lines, after carrying out the protective film applying step, an electromagnetic wave shield film forming step of forming the electromagnetic wave shield film for shielding electromagnetic waves by coating second surfaces and side surfaces of the semiconductor device chips with a metal film, and a protective film removing step of removing the protective film from the entire surface of the function layer on which the external connection electrodes are disposed, after carrying out the electromagnetic wave shield film forming step.

Preferably, the method further includes, after the protective film applying step and before the dividing step, a removing step of removing portions of the protective film along the projected dicing lines of the semiconductor substrate.

According to the present invention, since the upper and side surfaces of the semiconductor device chips are covered with the electromagnetic wave shield film, and when the semiconductor device chips are mounted on a mother board, the electromagnetic wave shield film is grounded through the ground interconnect, the semiconductor device chips do not adversely affect a wireless system with electromagnetic wave noise, without using metal sheet shields.

The above and other objects, features and advantages of the present invention and the manner of realizing them will become more apparent, and the invention itself will best be understood from a study of the following description and appended claims with reference to the attached drawings depicting some preferred embodiments of the invention.

DETAILED DESCRIPTION OF THE PREFERRED EMBODIMENTS

Figure 1A:
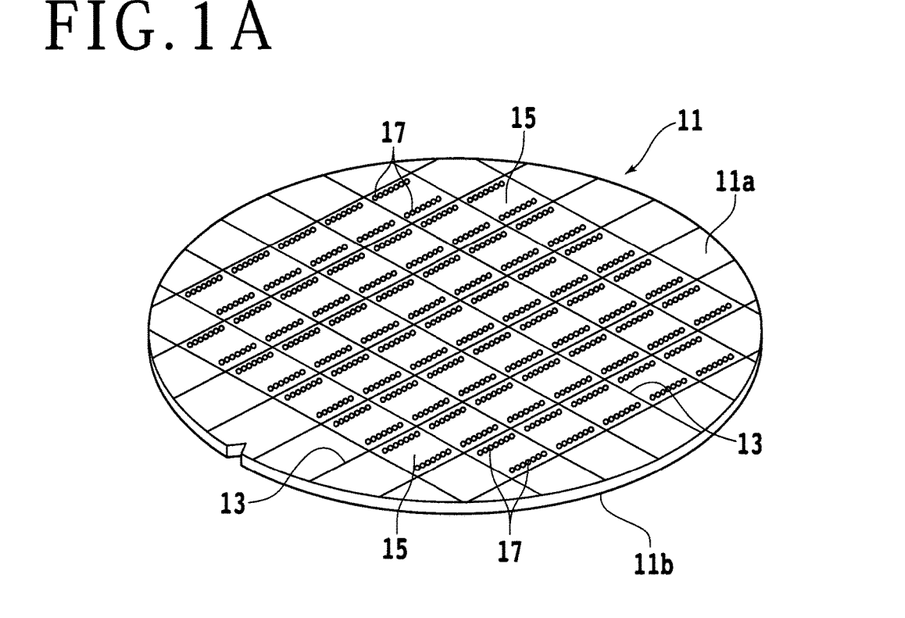
FIG. 1A is a perspective view of a semiconductor wafer having a plurality of bumps on a face side thereof.

Preferred embodiments of the present invention will be described in detail below with reference to the drawings. FIG. 1A depicts a semiconductor wafer 11 in perspective. As depicted in FIG. 1A, the semiconductor wafer 11 has on a face side 11a thereof a plurality of projected dicing lines 13 arranged in a grid-like pattern that demarcate areas where respective semiconductor devices 15 are formed. Each of the semiconductor devices 15 is connected to a plurality of external connection electrodes (bumps) 17 formed on the face side 11a of the semiconductor wafer 11.

Figure 1B:
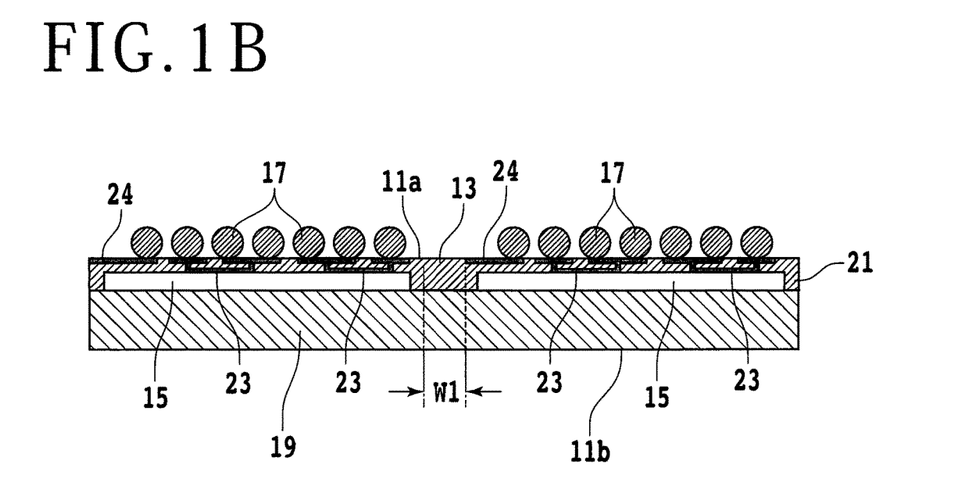
FIG. 1B is an enlarged fragmentary cross-sectional view of the semiconductor wafer depicted in FIG. 1.

More specifically, as depicted in FIG. 1B, the semiconductor wafer 11 includes a semiconductor substrate 19 made of silicon or the like and a function layer 21 disposed on the semiconductor substrate 19. The function layer 21 includes a plurality of electrically conductive films and a plurality of interlayer insulating films that alternate with the electrically conductive films. The semiconductor devices 15 are formed in respective areas demarcated in the function layer 21 by the projected dicing lines 13 by a photolithographic process that is well known in the art. The external connection electrodes (bumps) 17 are mounted on the surface of the function layer 21.

The semiconductor devices 15 and the bumps 17 are electrically connected by interconnect patterns 23 formed on the function layer 21. Ground interconnects 24 on the surface of the function layer 21 are also connected to some of the bumps 17. As depicted in FIG. 1B, the projected dicing lines 13 have a width W1, and the semiconductor substrate 19 is exposed on a reverse side 11b of the semiconductor wafer 11. In a method of manufacturing a semiconductor device chip according to an embodiment of the present invention, a semiconductor wafer preparing step is carried out to prepare the semiconductor wafer 11 described above.

Figure 2:
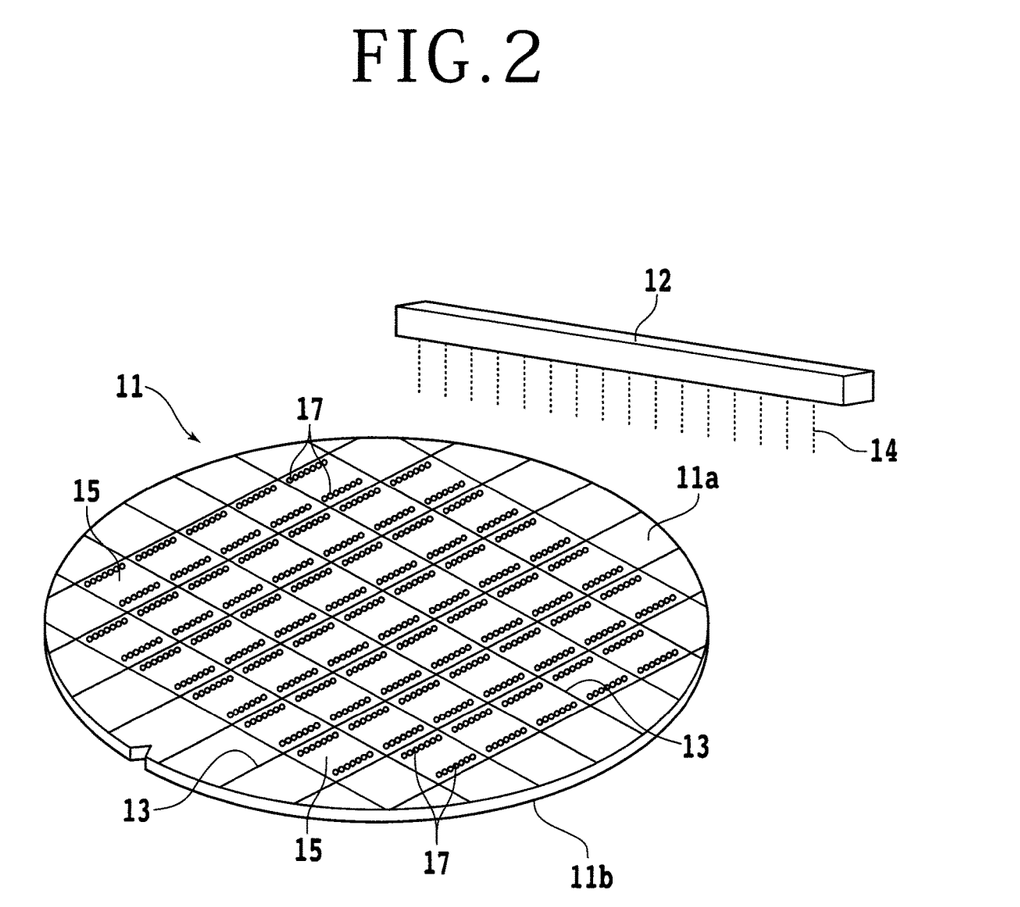
FIG. 2 is a perspective view depicting a protective film applying step by way of example.

Then, as depicted in FIG. 2, a protecting film applying step is carried out to coat the entire face side (first surface) 11a of the semiconductor wafer 11 on which the bumps 17 are disposed, with a liquid resin 14 supplied from a coating nozzle 12, thereby forming a protective film 25 on the face side 11a of the semiconductor wafer 11. The protecting film applying step may be performed by a screen printing process, a spray coating process, a laminating process, a spin coating process, an ink jet process, an evaporating process, or the like which is known in the art.

After the protecting film applying step, a semiconductor wafer supporting step is carried out by sticking the reverse side 11b of the semiconductor wafer 11 to a dicing tape T and also sticking an outer peripheral region of the dicing tape T to an annular frame (not depicted), so that the semiconductor wafer 11 is supported on the annular frame by the dicing tape T.

Figure 3:
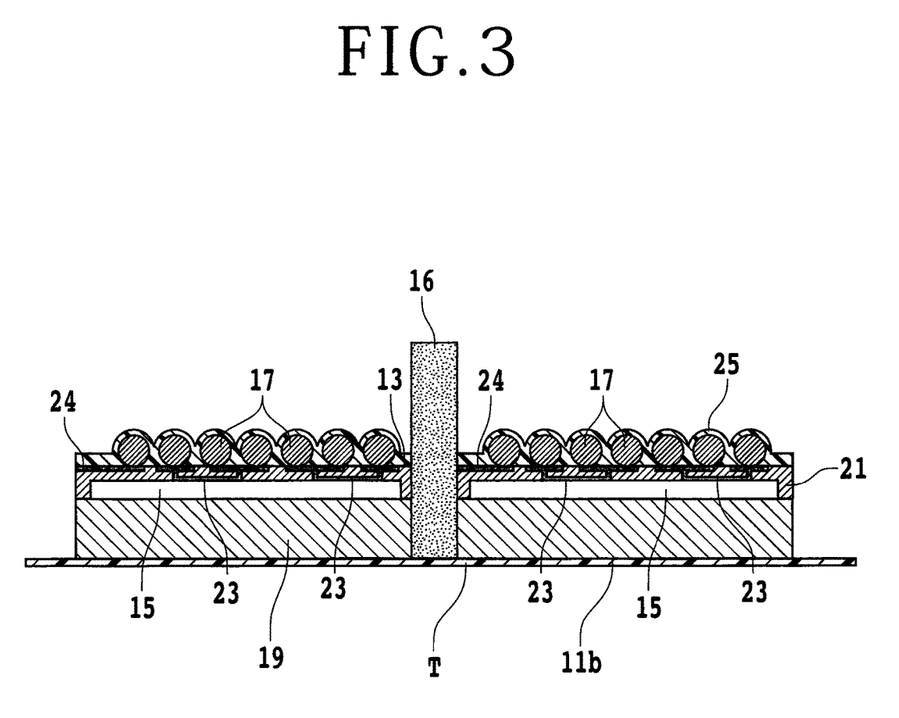
FIG. 3 is an enlarged fragmentary cross-sectional view of the semiconductor wafer, depicting a dividing step.

Then, the semiconductor wafer 11 is divided in a dividing step. In the dividing step, the semiconductor wafer 11 is held under suction by the chuck table of a cutting apparatus through the dicing tape T. As depicted in FIG. 3, the semiconductor wafer 11 is cut along all the projected dicing lines 13 that extend in mutually perpendicular directions, by a cutting blade 16 of the cutting apparatus, so that the semiconductor wafer 11 are divided into individual semiconductor device chips. In this dividing step, while the cutting blade 16 is moving along the projected dicing lines 13, the cutting blade 16 cuts into semiconductor wafer 11 down to the dicing tape T, fully cutting the semiconductor wafer 11.

Figure 4A:
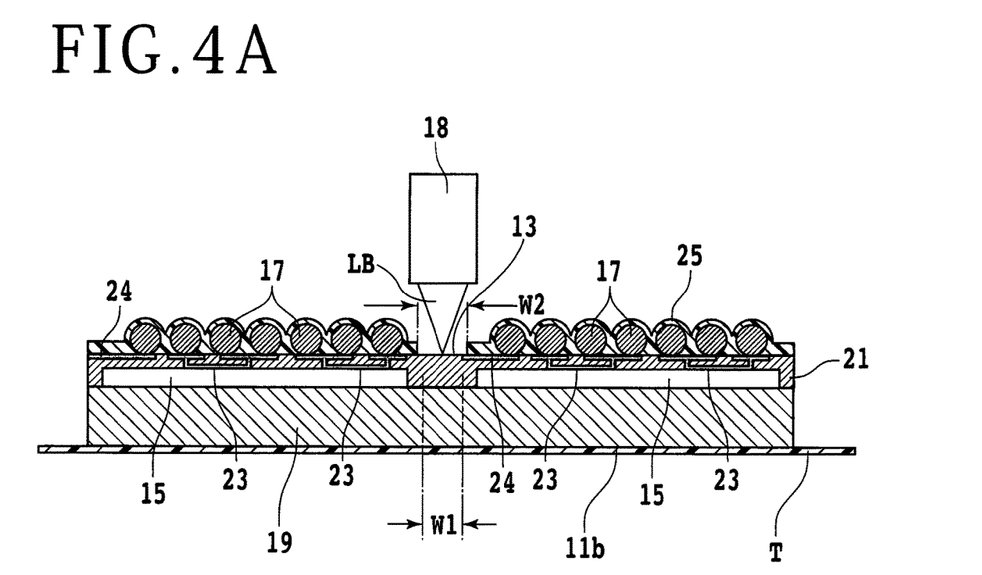
FIG. 4A is an enlarged fragmentary cross-sectional view of the semiconductor wafer, depicting a removing step of removing portions of protective film.

Preferably, as depicted in FIG. 4A, the dividing step is preceded by a removing step of removing a portion of a protective film, in which a pulsed laser beam LB having a wavelength that is absorbable by the protective film 25 is emitted from a beam condenser 18 of a laser beam application unit of a laser processing apparatus to be applied to the protective film 25 on the semiconductor wafer 11 to partly remove the protective film 25. In the removing step of removing a portion of a protective film, a strip-like portion of the protective film 25 which has a width W2 that is larger than the width W1 of the projected dicing lines 13 is removed. Therefore, it is necessary for the pulsed laser beam LB to scan each of the projected dicing lines 13 a plurality of times in order to cover the width W2. The removing step of removing a portion of a protective film is carried out in order to reliably connect an electromagnetic wave shield film to the ground interconnects 24 in a subsequent electromagnetic wave shield film forming step.

Figure 4B:
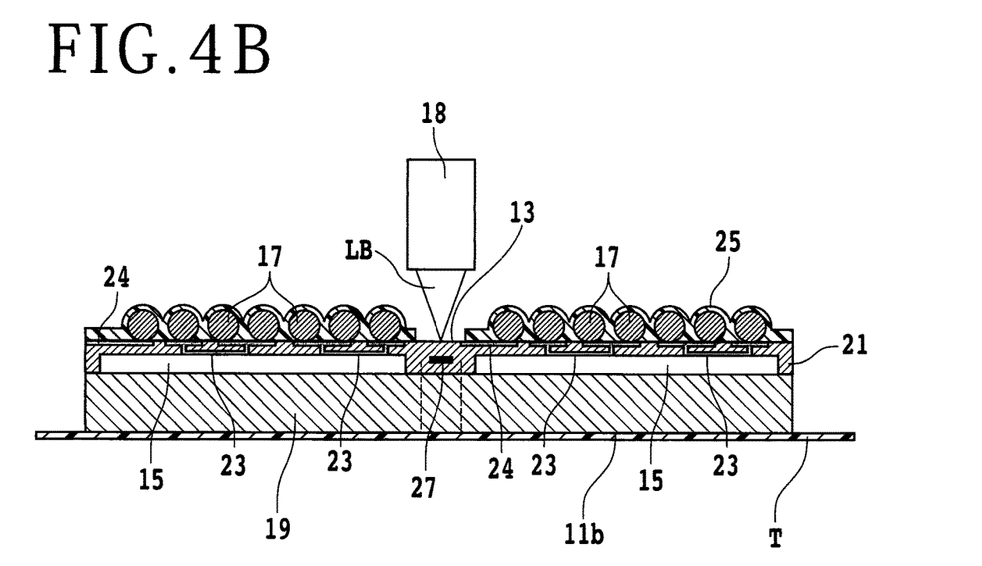
FIG. 4B is an enlarged fragmentary cross-sectional view of a semiconductor wafer having a laser beam shielding film disposed therein at a region corresponding to a projected dicing line, the view depicting the removing step of removing portions of protective film.

More preferably, as depicted in FIG. 4B, a laser beam shielding film 27 is formed in advance in a portion of the function layer 21 that corresponds to a substantially central portion of each of the projected dicing lines 13 which is to be irradiated with the pulsed laser beam LB. The laser beam shielding film 27 serves the purpose of preventing stray laser light of the pulsed laser beam LB from adversely affecting the semiconductor devices 15. In the dividing step, stray laser light of the pulsed laser beam LB is shielded by the laser beam shielding film 27 and hence prevented from adversely affecting the semiconductor devices 15.

Figure 5:
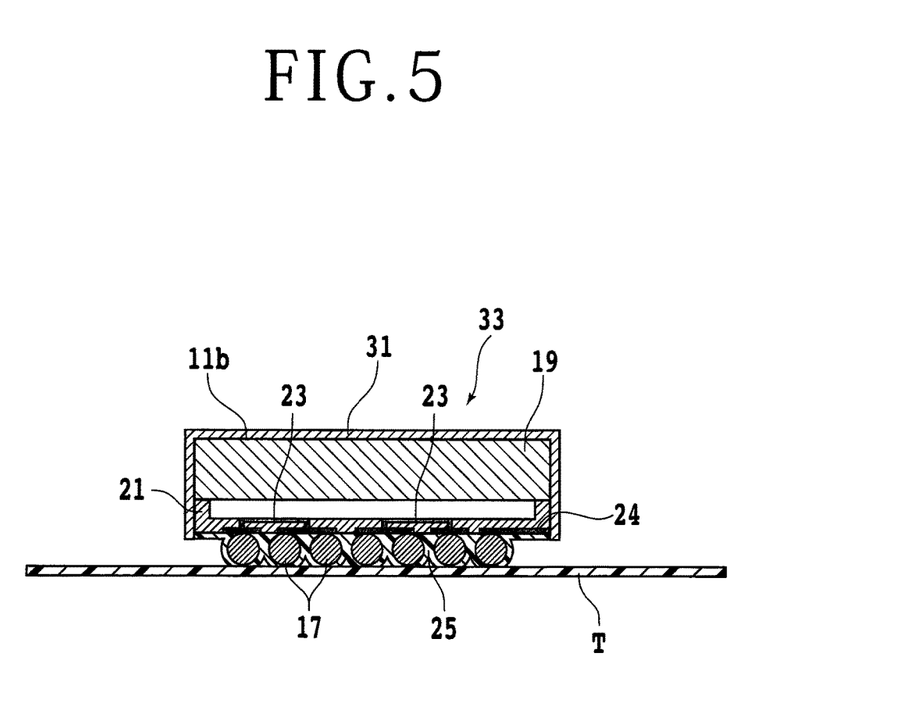
FIG. 5 is an enlarged cross-sectional view of a semiconductor device chip, depicting an electromagnetic wave shield film forming step.

The dividing step is followed by a semiconductor device chip supporting step in which the divided semiconductor device chips are turned upside down, or vertically inverted, and, as depicted in FIG. 5, the protective films 25 of the semiconductor device chips are stuck to a dicing tape T. An outer peripheral region of the dicing tape T is stuck to an annular frame (not depicted), so that the semiconductor device chips (one depicted in FIG. 5) are supported on the annular frame by the dicing tape T.

After the semiconductor device chip supporting step, the semiconductor device chips are processed in an electromagnetic wave shield film forming step. In the electromagnetic wave shield film forming step, as depicted in FIG. 5, the semiconductor device chips on the dicing tape T are loaded into a vapor deposition furnace in which upper and side surfaces of the semiconductor device chips are coated with a metal film as an electromagnetic wave shield film 31 for shielding electromagnetic waves, by chemical vapor deposition (CVD) or physical vapor deposition (PVD).

The electromagnetic wave shield film forming step completes semiconductor device chips 33 whose upper and side surfaces have been coated with the electromagnetic wave shield film 31. The electromagnetic wave shield film 31 has a thickness preferably in the range of 2 to 10 μm and more preferably in the range of 3 to 8 μm, for example. The electromagnetic wave shield film 31 may be made of copper, aluminum, nickel, stainless steel, or the like.

Figure 6:
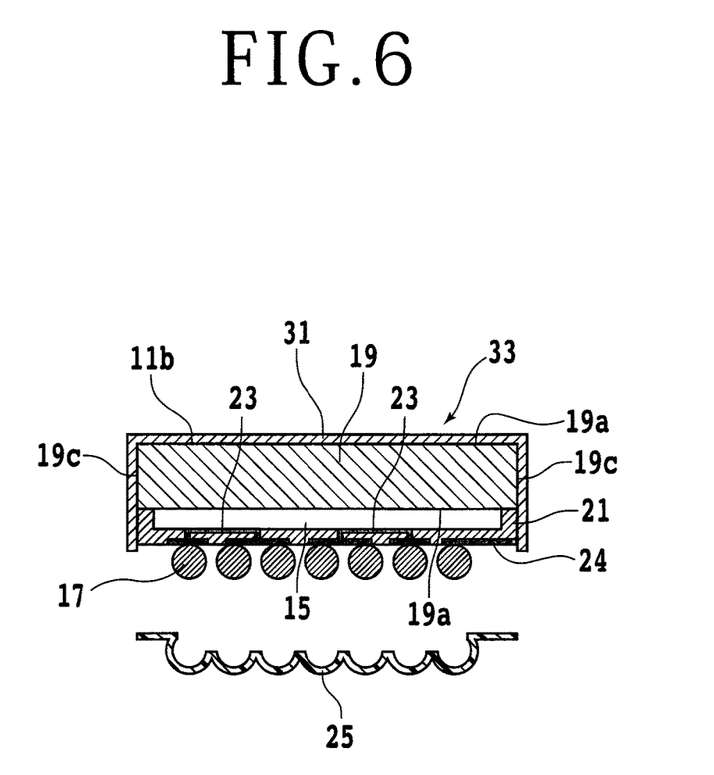
FIG. 6 is an enlarged cross-sectional view of the semiconductor device chip, depicting the protective film removing step.

After the electromagnetic wave shield film forming step, a protective film removing step is carried out to remove the protective film 25 from the face side (first surface) 11a of each of the semiconductor device chips 33 on which the external connection electrodes 17 are formed, as depicted in FIG. 6. In this state, the electromagnetic wave shield film 31 remains electrically connected to the ground interconnects 24 on the face side (first surface) 11a of each of the semiconductor device chips 33. Therefore, when a semiconductor device chip 33 is mounted on a mother board, not depicted, by flip chip bonding through the bumps 17, the electromagnetic wave shield film 31 is electrically connected to a ground pattern on the mother board through the ground interconnects 24 and the bumps 17, and hence is grounded.

The semiconductor device chip 33 depicted in FIG. 6 includes a semiconductor substrate 19 having a first surface 19a, a second surface 19b opposite to the first surface 19a, and side surfaces 19c, and a function layer 21 on the first surface 19a. The function layer 21 includes a plurality of electrically conductive films and a plurality of interlayer insulating films that alternate with the electrically conductive films. A semiconductor device 15 is formed in the function layer 21 by photolithography. A plurality of external connection electrodes (bumps) 17 are mounted on the surface of the function layer 21.

The semiconductor device 15 and the bumps 17 are electrically connected by interconnect patterns 23 formed on the function layer 21. Ground interconnects 24 on the surface of the function layer 21 are also electrically connected to some of the bumps 17. The upper surface (second surface) 19b and side surfaces 19c of the semiconductor substrate 19 and the side surfaces of the function layer 21 are covered with the electromagnetic wave shield film 31.

Figure 7A:
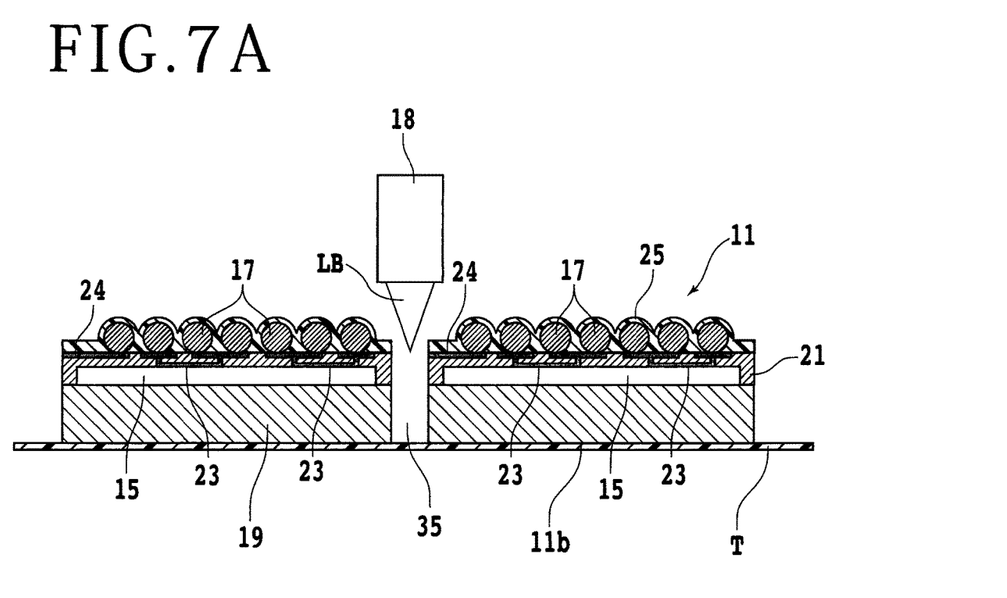
FIG. 7A is an enlarged fragmentary cross-sectional view of the semiconductor wafer, depicting a dividing step carried out by laser beam application.

FIG. 7A depicts in cross section a dividing step according to another embodiment of the present invention. According to the embodiment depicted in FIG. 7A, a pulsed laser beam LB having a wavelength (e.g., 355 nm) that is absorbable by the semiconductor substrate 19 and the protective film 25 is emitted from the beam condenser 18 to be applied to the projected dicing lines 13 of the semiconductor wafer 11 to form laser-processed grooves 35 by way of ablation, thereby fully cutting the semiconductor wafer 11 along the projected dicing lines 13.

The pulsed laser beam LB is applied to the semiconductor wafer 11 along all the projected dicing lines 13 that include those extending in a first direction and those extending in a second direction perpendicular to the first direction, thereby fully cutting or dividing the semiconductor wafer 11 into individual semiconductor device chips.

Figure 7B:
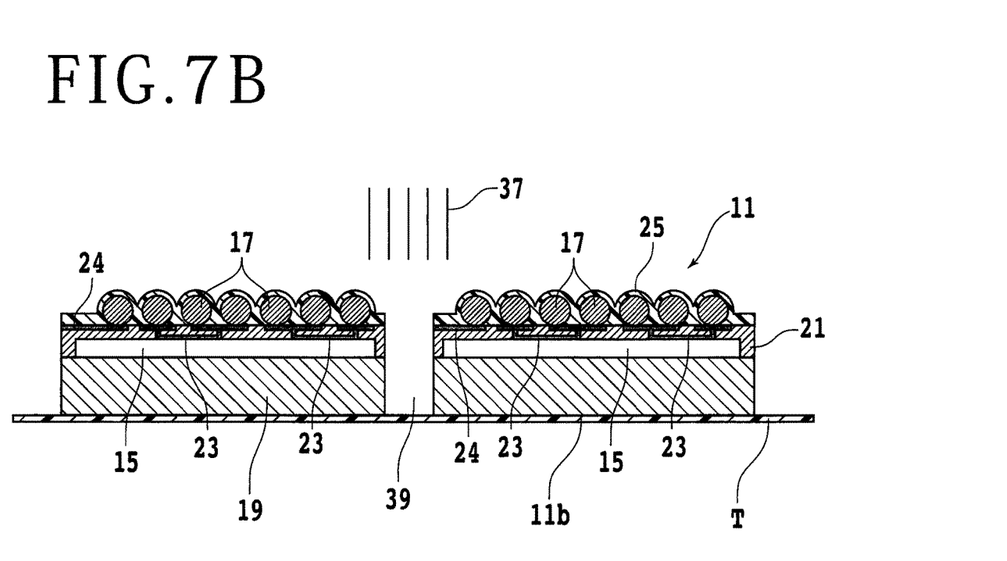
FIG. 7B is an enlarged fragmentary cross-sectional view of the semiconductor wafer, depicting a dividing step carried out by plasma etching.

FIG. 7B depicts in cross section a dividing step according to still another embodiment of the present invention. According to the embodiment depicted in FIG. 7B, after portions of the protective film have been removed from the semiconductor wafer 11 along the projected dicing lines by applying a laser beam to the projected film, a plasma 37 is applied to the semiconductor wafer 11 using the remaining protective film as a mask, to form dividing grooves 39 along all the projected dicing lines 13 by way of plasma etching, thereby dividing the semiconductor wafer 11 into individual semiconductor device chips.

After the dividing step depicted in FIG. 7A or the dividing step depicted in FIG. 7B has been carried out, the electromagnetic wave shield film forming step depicted in FIG. 5 and the protective film removing step depicted in FIG. 6 are carried out.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A semiconductor device chip comprising: a semiconductor substrate having a first surface and a second surface opposite to said first surface;
   a semiconductor device disposed on said first surface of the semiconductor substrate;
   an interconnect pattern having an end connected to said semiconductor device and another end exposed on a surface of a function layer disposed on said first surface of the semiconductor substrate, wherein the function layer comprises a plurality of electrically conductive films and a plurality of interlayer insulating films that alternate with the electrically conductive films;
   a plurality of external connection electrodes mounted on the surface of said function layer and electrically connected to the other end of said interconnect pattern;
   an electromagnetic wave shield film for shielding electromagnetic waves, the electromagnetic wave shield film being disposed in direct contact with said second surface of the semiconductor substrate and side surfaces of said function layer; and
   a ground interconnect electrically connected to said electromagnetic shield film and disposed on said function layer.

2. A method of manufacturing a semiconductor device chip, comprising:
   a preparing step of preparing a semiconductor wafer including a semiconductor substrate having a first surface, a function layer disposed on said first surface of the semiconductor substrate, a plurality of semiconductor devices each formed in respective areas demarcated on the function layer by a plurality of projected dicing lines thereon, a plurality of external connection electrodes disposed on a surface of said function layer, and an interconnect pattern disposed on said function layer and electrically connecting said semiconductor devices and said external connection electrodes to each other;
   a protective film applying step of applying a liquid resin on an entire surface of said function layer on which said external connection electrodes are disposed, thereby forming a protective film;
   a dividing step of dividing said semiconductor wafer into a plurality of individual semiconductor device chips along said projected dicing lines, after carrying out the protective film applying step;
   an electromagnetic wave shield film forming step of forming the electromagnetic wave shield film for shielding electromagnetic waves by coating second surfaces and side surfaces of the semiconductor device chips with a metal film, wherein the electromagnetic wave shield film forming step is performed after the dividing step; and
   a protective film removing step of removing the protective film from the entire surface of said function layer on which said external connection electrodes are disposed, after carrying out the electromagnetic wave shield film forming step.

3. The method according to claim 2, further comprising:
   a removing step of removing portions of said protective film along said projected dicing lines of the semiconductor substrate, after carrying out said protective film applying step and before the dividing step,
   wherein during the removing step of removing portions of said protective film, other portions of said protective film remain on said external connection electrodes; and
   further wherein during the protective film removing step, said other portions of said protective film are removed.

4. The method according to claim 2, wherein the dividing step of dividing said semiconductor wafer into the individual semiconductor device chips includes cutting the semiconductor wafer along said projected dicing lines with a cutting blade.

5. The method according to claim 2, wherein the dividing step of dividing said semiconductor wafer into the individual semiconductor device chips includes applying a laser beam having a wavelength that is absorbable by said semiconductor substrate to the semiconductor substrate along said projected dicing lines.

6. The method according to claim 2, wherein the dividing step of dividing said semiconductor wafer into the individual semiconductor device chips includes processing said semiconductor wafer by way of plasma etching along said projected dicing lines.

7. The method according to claim 2, wherein the function layer comprises a plurality of electrically conductive films and a plurality of interlayer insulating films that alternate with the electrically conductive films.

8. The method according to claim 2, further comprising an inverting step of turning the semiconductor device chips upside down after performing the dividing step but before performing the electromagnetic wave shield forming step.

* * * * *